US007889008B2

(12) United States Patent
Lee et al.

(10) Patent No.: US 7,889,008 B2
(45) Date of Patent: Feb. 15, 2011

(54) PROGRAMMABLE GAIN MOS AMPLIFIER

(75) Inventors: Yi-Bin Lee, Hsinchu (TW); Po-Sen Tseng, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 25 days.

(21) Appl. No.: 12/480,616

(22) Filed: Jun. 8, 2009

(65) Prior Publication Data

US 2010/0308916 A1 Dec. 9, 2010

(51) Int. Cl.
*H03G 3/10* (2006.01)
(52) U.S. Cl. .................. 330/278; 330/311
(58) Field of Classification Search .......... 330/278, 330/310, 311
See application file for complete search history.

(56) References Cited

U.S. PATENT DOCUMENTS

| | | | |
|---|---|---|---|
| 5,459,433 A * | 10/1995 | Fenk et al. | 330/254 |
| 5,703,524 A | 12/1997 | Chen | |
| 5,999,056 A * | 12/1999 | Fong | 330/278 |
| 6,639,447 B2 * | 10/2003 | Manku et al. | 327/359 |
| 6,888,411 B2 * | 5/2005 | Behzad et al. | 330/311 |
| 7,126,428 B2 * | 10/2006 | Lin et al. | 330/311 |
| 7,626,457 B2 * | 12/2009 | Mudd et al. | 330/254 |
| 2007/0279099 A1 * | 12/2007 | Goddard et al. | 326/83 |

* cited by examiner

*Primary Examiner*—Henry K Choe
(74) *Attorney, Agent, or Firm*—Winston Hsu; Scott Margo

(57) ABSTRACT

A programmable gain MOS amplifier is disclosed. The programmable gain MOS amplifier is capable of increasing its programmable gain linearly in dB unit by increasing its gain level data linearly. The programmable gain MOS amplifier includes a plurality of gain providers for providing predetermined gains respectively, and a plurality of gain tuners. Each of the plurality of the gain tuners is disposed for adjusting the predetermined gain from the corresponding gain provider. Each of the gain tuners includes a gain enabling module and a gain decreasing module. The gain enabling module allows the corresponding predetermined gain to add to the programmable gain of the MOS amplifier. The gain decreasing module declines the corresponding predetermined gain added to the programmable gain of the MOS amplifier.

21 Claims, 8 Drawing Sheets

| Gain level | Magnitude | dB | Gain level combination |
|---|---|---|---|
| 0 | 1 | 0 | |
| 1 | 0.5 | -6.0206 | 1 |
| 2 | 0.571429 | -4.86075 | 2 |
| 3 | 0.615385 | -4.21706 | 3 |
| 4 | 0.727273 | -2.76605 | 4 |
| 5 | 0.8 | -1.9382 | 5 |
| 6 | 0.888889 | -1.02305 | 6 |
| 7 | 1 | 0 | 7 |
| 8 | 1.103448 | 0.855037 | 8 |
| 9 | 1.28 | 2.144199 | 9 |
| 10 | 1.391304 | 2.868441 | 10 |
| 11 | 1.6 | 4.0824 | 11 |
| 12 | 1.777778 | 4.997551 | 12 |
| 13 | 2 | 6.0206 | 13 |
| 14 | 2.215385 | 6.908983 | 11+3 |
| 15 | 2.488889 | 7.92011 | 11+6 |
| 16 | 2.8 | 8.943161 | 13+5 |
| 17 | 3.168889 | 10.01814 | 0+6+9 |
| 18 | 3.577778 | 11.07227 | 0+5+12 |
| 19 | 4 | 12.0412 | 19 |
| 20 | 4.5 | 13.06425 | 1+19 |
| 21 | 5 | 13.9794 | 7+19 |
| 22 | 5.615385 | 14.98759 | 0+3+15 |
| 23 | 6.28 | 15.95919 | 7+9+19 |
| 24 | 7 | 16.90196 | 7+13+19 |
| 25 | 8 | 18.0618 | 25 |
| 26 | 9 | 19.08485 | 0+25 |
| 27 | 10 | 20 | 13+25 |
| 28 | 11.28 | 21.04618 | 0+7+9+25 |
| 29 | 12.57143 | 21.98769 | 2+19+25 |
| 30 | 14.10345 | 22.98651 | 0+8+19+25 |
| 31 | 16 | 24.0824 | 31 |
| 32 | 17.77778 | 24.99755 | 12+31 |
| 33 | 20 | 26.0206 | 19+31 |
| 34 | 22.3913 | 27.00159 | 0+10+19+31 |
| 35 | 25.10345 | 27.99467 | 8+25+31 |
| 36 | 28 | 28.94316 | 19+25+31 |
| 37 | 31.6 | 29.99374 | 0+3+13+19+25+31 |

FIG. 6

| Gain level | $S_0$ | $S_1$ | $S_2$ | $S_3$ | $S_4$ | $S_5$ | $S_6$ | $S_7$ | $S_8$ | $S_9$ | $S_{10}$ | $S_{11}$ |
|---|---|---|---|---|---|---|---|---|---|---|---|---|
| 1 | 0 | 1 | 1 | 1 | 1 | 0 | 0 | 0 | 0 | 0 | 0 | 0 |
| 2 | 0 | 1 | 1 | 0 | 1 | 0 | 0 | 0 | 0 | 0 | 0 | 0 |
| 3 | 0 | 1 | 0 | 0 | 1 | 0 | 0 | 0 | 0 | 0 | 0 | 0 |
| 4 | 0 | 1 | 1 | 1 | 0 | 0 | 0 | 0 | 0 | 0 | 0 | 0 |
| 5 | 0 | 1 | 0 | 1 | 0 | 0 | 0 | 0 | 0 | 0 | 0 | 0 |
| 6 | 0 | 1 | 1 | 0 | 0 | 0 | 0 | 0 | 0 | 0 | 0 | 0 |
| 7 | 0 | 1 | 0 | 0 | 0 | 0 | 0 | 0 | 0 | 0 | 0 | 0 |
| 8 | 0 | 0 | 0 | 0 | 0 | 1 | 1 | 1 | 1 | 0 | 0 | 0 |
| 9 | 0 | 0 | 0 | 0 | 0 | 1 | 1 | 0 | 1 | 0 | 0 | 0 |
| 10 | 0 | 0 | 0 | 0 | 0 | 1 | 0 | 0 | 1 | 0 | 0 | 0 |
| 11 | 0 | 0 | 0 | 0 | 0 | 1 | 0 | 1 | 0 | 0 | 0 | 0 |
| 12 | 0 | 0 | 0 | 0 | 0 | 1 | 1 | 0 | 0 | 0 | 0 | 0 |
| 13 | 0 | 0 | 0 | 0 | 0 | 1 | 0 | 0 | 0 | 0 | 0 | 0 |
| 14 | 0 | 1 | 0 | 0 | 1 | 1 | 0 | 1 | 0 | 0 | 0 | 0 |
| 15 | 0 | 1 | 1 | 0 | 0 | 1 | 0 | 1 | 0 | 0 | 0 | 0 |
| 16 | 0 | 1 | 0 | 1 | 0 | 1 | 0 | 0 | 0 | 0 | 0 | 0 |
| 17 | 1 | 1 | 1 | 0 | 0 | 1 | 1 | 0 | 1 | 0 | 0 | 0 |
| 18 | 1 | 1 | 0 | 1 | 0 | 1 | 1 | 0 | 0 | 0 | 0 | 0 |
| 19 | 0 | 0 | 0 | 0 | 0 | 0 | 0 | 0 | 0 | 1 | 0 | 0 |
| 20 | 0 | 1 | 1 | 1 | 1 | 0 | 0 | 0 | 0 | 1 | 0 | 0 |
| 21 | 0 | 1 | 0 | 0 | 0 | 0 | 0 | 0 | 0 | 1 | 0 | 0 |
| 22 | 1 | 1 | 0 | 0 | 1 | 0 | 0 | 0 | 0 | 1 | 0 | 0 |
| 23 | 0 | 1 | 0 | 0 | 0 | 1 | 1 | 0 | 1 | 1 | 0 | 0 |
| 24 | 1 | 1 | 0 | 1 | 0 | 1 | 1 | 0 | 1 | 1 | 0 | 0 |
| 25 | 0 | 0 | 0 | 0 | 0 | 0 | 0 | 0 | 0 | 0 | 1 | 0 |
| 26 | 0 | 1 | 1 | 0 | 0 | 0 | 0 | 0 | 0 | 0 | 1 | 0 |
| 27 | 0 | 0 | 0 | 0 | 0 | 1 | 0 | 0 | 0 | 0 | 1 | 0 |
| 28 | 1 | 1 | 0 | 0 | 0 | 1 | 1 | 0 | 1 | 0 | 1 | 0 |
| 29 | 0 | 1 | 1 | 0 | 1 | 0 | 0 | 0 | 0 | 1 | 1 | 0 |
| 30 | 1 | 0 | 0 | 0 | 0 | 1 | 1 | 1 | 1 | 1 | 1 | 0 |
| 31 | 0 | 0 | 0 | 0 | 0 | 0 | 0 | 0 | 0 | 0 | 0 | 1 |
| 32 | 0 | 0 | 0 | 0 | 0 | 1 | 1 | 0 | 0 | 0 | 0 | 1 |
| 33 | 0 | 0 | 0 | 0 | 0 | 0 | 0 | 0 | 1 | 0 | 1 |
| 34 | 1 | 0 | 0 | 0 | 0 | 1 | 0 | 0 | 1 | 1 | 0 | 1 |
| 35 | 0 | 0 | 0 | 0 | 0 | 1 | 1 | 1 | 1 | 0 | 1 | 1 |
| 36 | 0 | 0 | 0 | 0 | 0 | 0 | 0 | 0 | 0 | 1 | 1 | 1 |
| 37 | 1 | 1 | 0 | 0 | 1 | 1 | 0 | 0 | 0 | 1 | 1 | 1 |

FIG. 7

PROGRAMMABLE GAIN MOS AMPLIFIER

BACKGROUND OF THE INVENTION

1. Field of the Invention

The present invention relates to a programmable gain Metal-Oxide-Semiconductor (MOS) amplifier, and more particularly, to a linear-to-dB programmable gain MOS amplifier.

2. Description of the Prior Art

Please refer to FIG. 1. FIG. 1 is a diagram illustrating a conventional linear-to-dB Bipolar-Junction-Transistor (BJT) amplifier 100. As shown in FIG. 1, the linear-to-dB BJT amplifier 100 comprises BJTs $B_1$, $B_2$, $B_3$, and $B_4$, and a resistor $R_B$. The collector of the BJT $B_1$ receives an input current signal $I_{IN}$, the base of the BJT $B_1$ receives a control current signal $I_{CON}$, and the emitter of the BJT $B_1$ is coupled to a biasing source $V_{SS}$ (for example, ground). The collector of the BJT $B_2$ is coupled to a biasing source $V_{DD}$, the base of the BJT $B_2$ receives the input current signal $I_{IN}$, and the emitter of the BJT $B_2$ receives the control current signal $I_{CON}$. The collector of the BJT $B_3$ is coupled to the biasing source $V_{DD}$, the base of the BJT $B_3$ receives the input current signal $I_{IN}$, and the emitter of the BJT $B_3$ receives the control current signal $I_{CON}$ through the resistor $R_B$. The first end of the resistor $R_B$ is coupled to the emitter of the BJT $B_3$, and the second end of the resistor $R_B$ is coupled to the base of the BJT $B_4$. The base of the BJT $B_4$ is coupled to the second end of the resistor $R_B$ and receives the control current signal $I_{CON}$, the emitter of the BJT $B_4$ is coupled to the biasing source $V_{SS}$, and the collector of the BJT $B_4$ outputs the output current signal $I_{OUT}$.

All the BJTs in FIG. 1 are appropriately biased, and thus, the relation between base-emitter voltages $V_{BE}$s of all the BJTs can be described as an equation as follows:

$$V_{BE1}+V_{BE2}=V_{BE3}+I_{CON} \times R_B+V_{BE4} \quad (1),$$

where $V_{BE1}$ represents the base-emitter voltage of the $BJT_1$, $V_{BE2}$ represents the base-emitter voltage of the $BJT_2$, $V_{BE3}$ represents the base-emitter voltage of the $BJT_3$, and $V_{BE4}$ represents the base-emitter voltage of the $BJT_4$. Since the relation between the base-emitter voltage $V_{BE}$ of a BJT and the current flowing from the BJT can be described as an equation as follows:

$$I_E = I_S e^{V_{BE}/V_T} \quad (2),$$

where e represents natural exponent, $I_E$ represents the current flowing from the emitter of the BJT, $V_{BE}$ represents the base-emitter voltage of the BJT, $V_T$ represents the threshold voltage of the BJT, and the $I_S$ represents the saturation current of the BJT, the further equations can be derived from the equations (1) and (2):

$$V_T \ln(I_{IN}/I_S)+V_T \ln(I_{CON}/I_S)=V_T \ln(I_{CON}/I_S)+I_{CON} \times R_B+V_T \ln(I_{OUT}/I_S) \quad (3)$$

$$\ln(I_{OUT}/I_{IN})=(-I_{CON} \times R_B)/V_T \quad (4)$$

$$I_{OUT}=I_{IN} \times e^{(-I_{CON} \times R_B)/V_T} \quad (5)$$

$$G_{100}=e^{(-I_{CON} \times R_B)/V_T} \quad (6)$$

$$G_{100}=20 \times (1/\ln 10) \times [(-I_{CON} \times R_B)/V_T] (dB) \quad (7)$$

where $G_{100}$ represent the gain of the BJT amplifier 100, and the difference between the equations (6) and (7) is that $G_{100}$ in equation (7) is expressed in dB (decibel). Therefore, according to the equation (7), the gain $G_{100}$ of the BJT amplifier 100 can be adjusted in dB units by linearly adjusting the control current signal $I_{CON}$. More particularly, the gain $G_{100}$ of the BJT amplifier 100 can be adjusted in dB linearly as the control current signal $I_{CON}$ is linearly adjusted, which provides great convenience.

However, since the exponential characteristic does not exist between the gate-source voltage ($V_{GS}$) of a MOS and its corresponding output current $I_D$, it is complicated to achieve adjusting the gain in dB linearly by linearly adjusting the magnitude of the controlling signal with a MOS amplifier.

SUMMARY OF THE INVENTION

The present invention provides a programmable gain MOS amplifier for outputting an amplified signal at a first end of a load with a programmable gain. The programmable gain MOS amplifier comprises a first gain provider for providing a first predetermined gain, comprising a MOS transistor having a first predetermined aspect ratio corresponding to the first predetermined gain, the MOS transistor comprising a control end coupled to an input end of the programmable gain MOS amplifier for receiving an input signal; a biasing end coupled to a biasing source; and an output end; and a first gain tuner for adjusting the first predetermined gain, comprising a gain enabling module, comprising a MOS transistor, comprising a control end for receiving a first controlling signal; a first end coupled to the first end of the load; and a second end coupled to the output end of the MOS transistor of the first gain provider; and a gain decreasing module, comprising a first MOS transistor, comprising a control end for receiving a second controlling signal; a first end coupled to a second end of the load; and a second end coupled to the output end of the MOS transistor of the first gain provider; wherein when the first controlling signal turns on the MOS transistor of the gain enabling module of the first gain tuner, the programmable gain equals the G1; when the first controlling signal turns on the MOS transistor of the gain enabling module of the first gain tuner and the second controlling signal turns on the first MOS transistor of the gain decreasing module of the first gain tuner, the programmable gain equals [M1/(M1+M2)]×G1; M1 represents an aspect ratio of the MOS transistor of the gain enabling module of the first gain tuner, M2 represents an aspect ratio of the first MOS transistor of the gain decreasing module of the first gain tuner, and G1 represents the first predetermined gain.

The present invention further provides a programmable gain MOS amplifier for outputting an amplified signal at a first end of a load with a programmable gain according to a gain level data. The programmable gain MOS amplifier comprises a decoder for decoding the gain level data to a plurality of controlling signals; a plurality of gain providers, each gain provider providing a predetermined gain, each gain provider comprising a MOS transistor having a predetermined aspect ratio corresponding to a corresponding predetermined gain, the MOS transistor comprising a control end coupled to an input end of the programmable gain MOS amplifier for receiving an input signal; a biasing end coupled to a biasing source; and an output end; and a plurality of gain tuners, each gain tuner adjusting a predetermined gain from corresponding one of the plurality of the gain providers, each gain tuner comprising a gain enabling module, comprising a MOS transistor, comprising a control end, coupled to the decoder, for receiving a corresponding controlling signal; a first end coupled to the first end of the load; and a second end coupled to the output end of the MOS transistor of the corresponding gain provider; wherein a predetermined gain provided from one of the plurality of the gain providers is added to the programmable gain of the MOS amplifier when the MOS transistor of the gain enabling module of the corresponding gain tuner is turned on by the corresponding controlling signal decoded from the gain level data.

The present invention further provides a programmable gain MOS amplifier for outputting an amplified signal at a first end of a load with a programmable gain according to a gain level data. The programmable gain MOS amplifier comprises a decoder for decoding the gain level data to a plurality of controlling signals; a first gain provider for providing a first predetermined gain, comprising a first MOS transistor having a first predetermined aspect ratio corresponding to the first predetermined gain, the first MOS transistor comprising a control end coupled to an input end of the programmable gain MOS amplifier for receiving an input signal; a biasing end coupled to a biasing source; and an output end; and a first gain tuner for adjusting the first predetermined gain, comprising a gain enabling module, comprising a second MOS transistor, comprising a control end coupled to the decoder for receiving a corresponding controlling signal; a first end coupled to the first end of the load; and a second end coupled to the output end of the second MOS transistor of the first gain provider; and a gain decreasing module, comprising M third MOS transistors, each third MOS transistor comprising a control end coupled to the decoder for receiving a corresponding controlling signal; a first end coupled to a second end of the load; and a second end coupled to the output end of the corresponding third MOS transistor of the first gain provider; a second gain provider for providing a second predetermined gain, comprising a fourth MOS transistor having a second predetermined aspect ratio corresponding to the second predetermined gain, the fourth MOS transistor comprising a control end coupled to the input end of the programmable gain MOS amplifier for receiving the input signal; a biasing end coupled to the biasing source; and an output end; and a second gain tuner for adjusting the second predetermined gain, comprising a gain enabling module, comprising a fifth MOS transistor, comprising a control end coupled to the decoder for receiving a corresponding controlling signal; a first end coupled to the first end of the load; and a second end coupled to the output end of the fifth MOS transistor of the second gain provider; wherein the second predetermined gain is higher than the first predetermined gain; wherein the programmable gain is obtained from the first predetermined gain adjusted by the first gain tuner and the second predetermined gain adjusted by the second gain tuner.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a diagram illustrating the magnitude, and the magnitude in dB, corresponding to the gain level of the MOS amplifier according to the third embodiment of the present invention.

FIG. 7 is a diagram illustrating the controlling signals of each gain level of the MOS amplifier according to the third embodiment of the present invention.

DETAILED DESCRIPTION

Figure 1:
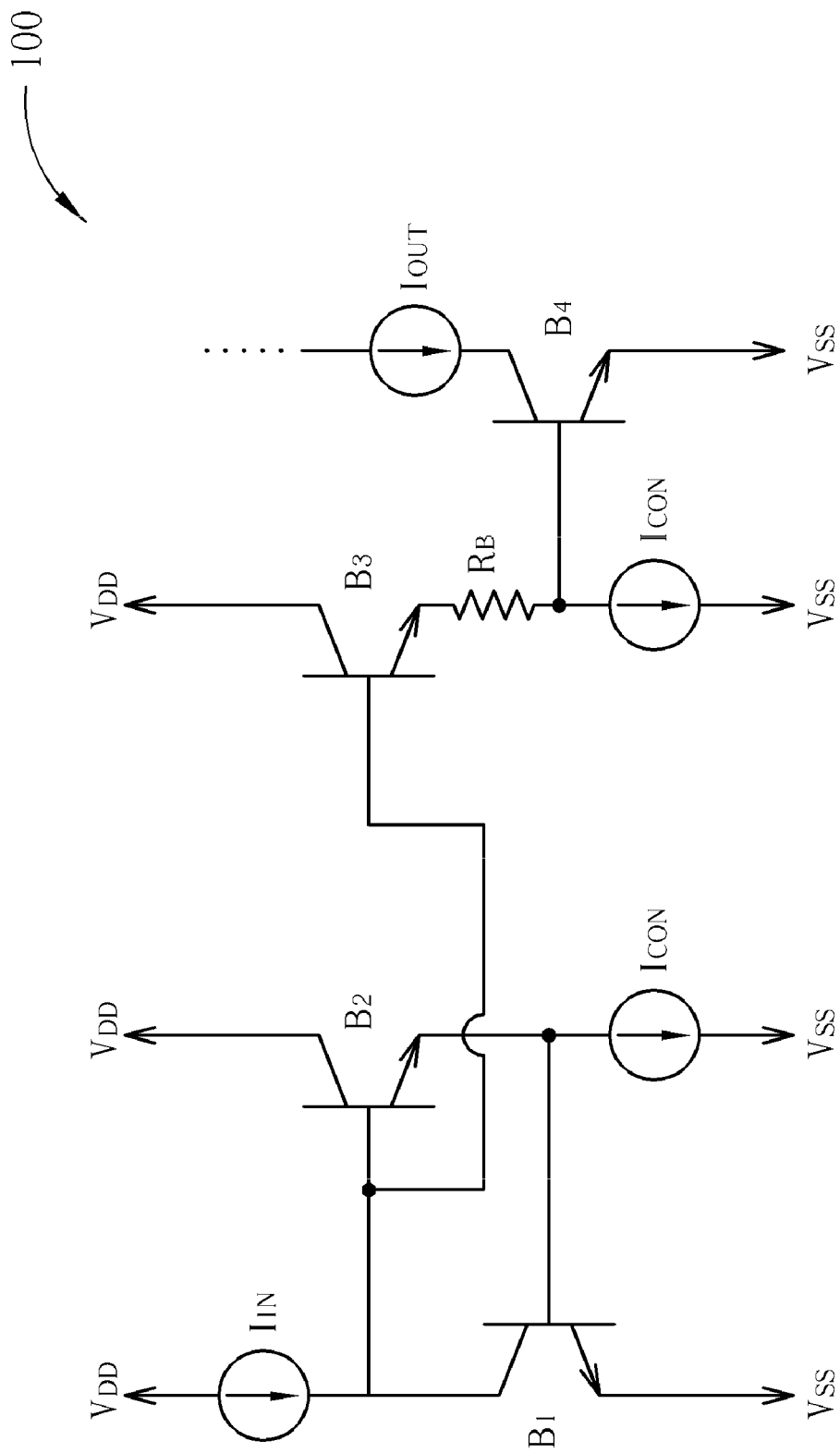
FIG. 1 is a diagram illustrating a conventional linear-to-dB BJT amplifier.
Figure 2:
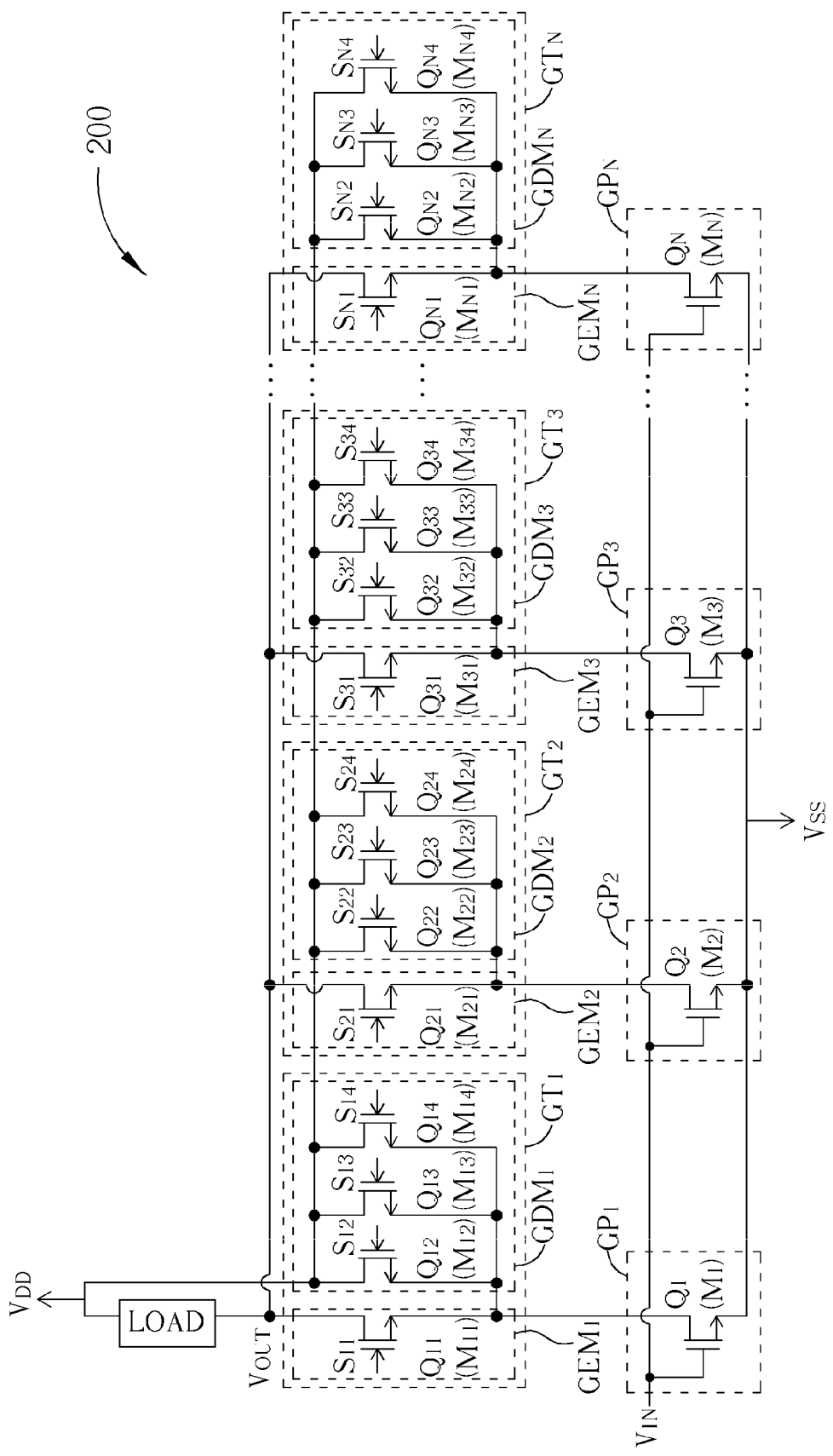
FIG. 2 is a diagram illustrating a MOS amplifier according to a first embodiment of the present invention.

Please refer to FIG. 2. FIG. 2 is a diagram illustrating a MOS amplifier 200 according to a first embodiment of the present invention. As shown in FIG. 2, the MOS amplifier 200 comprises N gain providers $GP_1 \sim GP_N$, and N gain tuners $GT_1 \sim GT_N$.

Each gain tuner further comprises a gain enabling module GEM and a gain decreasing module GDM. For example, the gain tuner $GT_1$ comprises the gain enabling module $GEM_1$ and the gain decreasing module $GDM_1$. Each gain enabling module GEM is realized with a MOS transistor. For example, the gain enabling module $GEM_1$ is realized with the MOS transistor $Q_{11}$ having an aspect ratio $M_{11}$. Each gain decreasing module GDM is realized with three MOS transistors. For example, the gain decreasing module $GDM_1$ is realized with the MOS transistors $Q_{12}$, $Q_{13}$, and $Q_{14}$ having aspect ratio $M_{12}$, $M_{13}$, and $M_{14}$, respectively. Each gain tuner corresponds to a gain provider. For example, the gain tuner $GT_1$ corresponds to the gain provider $GP_1$. Additionally, the sum of the aspect ratios of the gain decreasing module equals the aspect ratio of the corresponding gain enabling module. For example, in the gain tuner $GT_1$, the sum of the aspect ratios $(M_{12}+M_{13}+M_{14})$ for the gain decreasing module $GDM_1$ equals the aspect ratio $(M_{11})$ for the gain enabling module $GEM_1$. However, the aspect ratios of the gain enabling module and the gain decreasing module can be set depending on design, which means the sum of the aspect ratios of one decreasing module does not have to be the same as the aspect ratio of the corresponding gain enabling module, and furthermore, the number of the MOS transistors employed by each gain decreasing module can be set as desired and is not limited to be the same as others. The present embodiment is only illustrated as an exemplary embodiment for easier understanding.

The gain provider is realized with a MOS transistor. For example, the gain provider $GP_1$ is realized with the MOS transistor $Q_1$ having an aspect ratio $M_1$. Therefore, as shown in FIG. 2, the control end (gate) of the MOS transistor $Q_1$ is coupled to an input end of the MOS amplifier 200 for receiving an input signal $V_{IN}$, the biasing end (source) of the MOS transistor $Q_1$ is coupled to a biasing source $V_{SS}$, and the output end of the MOS transistor $Q_1$ is coupled to the corresponding gain tuner $GT_1$.

In the gain enabling module $GEM_1$, the control end (gate) of the MOS transistor $Q_{11}$ receives a controlling signal $S_{11}$, the first end (drain) of the MOS transistor $Q_{11}$ is coupled to a first end of a load, and the second end (source) of the MOS transistor $Q_{11}$ is coupled to the output end of the MOS transistor $Q_1$. In the gain decreasing module $GDM_1$, the control end (gate) of the MOS transistor $Q_{12}$ receives a controlling signal $S_{12}$, the first end (drain) of the MOS transistor $Q_{12}$ is coupled to a second end of the load, and the second end (source) of the MOS transistor $Q_{12}$ is coupled to the output end of the MOS transistor $Q_1$; the control end (gate) of the MOS transistor $Q_{13}$ receives a controlling signal $S_{13}$, the first end (drain) of the MOS transistor $Q_{13}$ is coupled to the second end of the load, and the second end (source) of the MOS transistor $Q_{13}$ is coupled to the output end of the MOS transistor $Q_1$; the control end (gate) of the MOS transistor $Q_{14}$ receives a controlling signal $S_{14}$, the first end (drain) of the MOS transistor $Q_{14}$ is coupled to a second end of the load, and the second end (source) of the MOS transistor $Q_{14}$ is coupled to the output end of the MOS transistor $Q_1$.

The rest gain providers, gain tuners, gain enabling modules, and gain decreasing modules have similar structure and connections as described above and therefore the related description is omitted. The first end of the load is set as the output end of the MOS amplifier 200 for outputting an output signal $V_{OUT}$, and the second end of the load is coupled to a biasing source $V_{DD}$. Of course, the output signal $V_{OUT}$ is amplified according to the programmable gain of the MOS amplifier 200 from the input signal $V_{IN}$. Additionally, the MOS transistors of the gain providers are utilized as amplifiers, and the MOS transistors of the gain enabling modules and the gain decreasing modules are only utilized as switches merely.

Each gain provider provides a gain of different value as desired. However, same value of the gains of some gain providers can be designed as well. Under the condition that a MOS transistor is appropriately biased, when the MOS transistor is utilized as a common source amplifier, the gain of the amplifier is proportional to the aspect ratio M of the MOS transistor. Therefore, the MOS transistors $Q_1 \sim Q_N$ of the gain providers $GP_1 \sim GP_N$ are designed with different aspect ratios $M_1 \sim M_N$ and the corresponding gains $G_1 \sim G_N$ are obtained. Assuming the gain $G_1$ is $G_{INI}$, and thus the gain $G_2$ is $(M_2/M_1)G_{INI}$, the gain $G_3$ is $(M_3/M_1)G_{INI}$, and so on.

When a gain enabling module is turned on (by the corresponding controlling signal), the gain of the corresponding gain provider is added to the total gain of the MOS amplifier 200. For example, when the gain enabling module $GEM_1$ is enabled, which means that the MOS transistor $Q_{11}$ is turned on by the controlling signal $S_{11}$, the total gain of the MOS amplifier 200 is added with the gain $G_1$, which is $G_{INI}$; when the gain enabling modules $GEM_1$ and $GEM_2$ is enabled, the total gain of the MOS amplifier 200 is added with the gains $G_1$ and $G_2$, which equals to $[(M_2+M_1)/M_1]G_{INI}$; when all the gain enabling modules $GEM_1 \sim GEM_N$ are enabled, the total gain of the MOS amplifier 200 is $[(M_N+M_{(N-1)}+\ldots+M_3+M_2+M_1)/M_1]G_{INI}$.

When a gain decreasing module is turned on while the corresponding gain enabling module is turned on, the gain of the corresponding gain provider is decreased, and the decreasing degree can be set by controlling the gain decreasing module. In other words, when a gain enabling module is turned on, the current sunk by the MOS transistor of the corresponding gain provider directly flows from the load to the output end of the MOS transistor, and the gain of the MOS transistor of the corresponding gain provider is completely added to the total gain of the MOS amplifier 200; when a gain decreasing module is turned on while the corresponding gain enabling module is turned on, the current sunk by the MOS transistor of the corresponding gain provider partially flows from the load and partially flows from the biasing source $V_{DD}$ through the MOS transistors turned on in the gain decreasing module, the gain of the MOS transistor of the corresponding gain provider is partially added to the total gain of the MOS amplifier 200. For example, when the MOS transistor $Q_{11}$ is turned on, the gain of the MOS amplifier 200 is $G_1$; when the MOS transistor $Q_{11}$ and $Q_{12}$ are turned on, the gain of the MOS amplifier 200 is $[M_{11}/(M_{11}+M_{12})]\times G_1$; when the MOS transistor $Q_{11}$, $Q_{12}$, and $Q_{13}$ are turned on, the gain of the MOS amplifier 200 is $[M_{11}/(M_{11}+M_{12}+M_{13})]\times G_1$; when the MOS transistor $Q_{11}$, $Q_{12}$, $Q_{13}$, and $Q_{14}$ are turned on, the gain of the MOS amplifier 200 is $[M_{11}/(M_{11}+M_{12}+M_{13}+M_{14})]\times G_1$.

Therefore, the total gain of the MOS amplifier 200 can be adjusted by controlling the on/off states of the MOS transistors of the gain enabling modules and the gain decreasing modules of the MOS amplifier 200.

Figure 3:
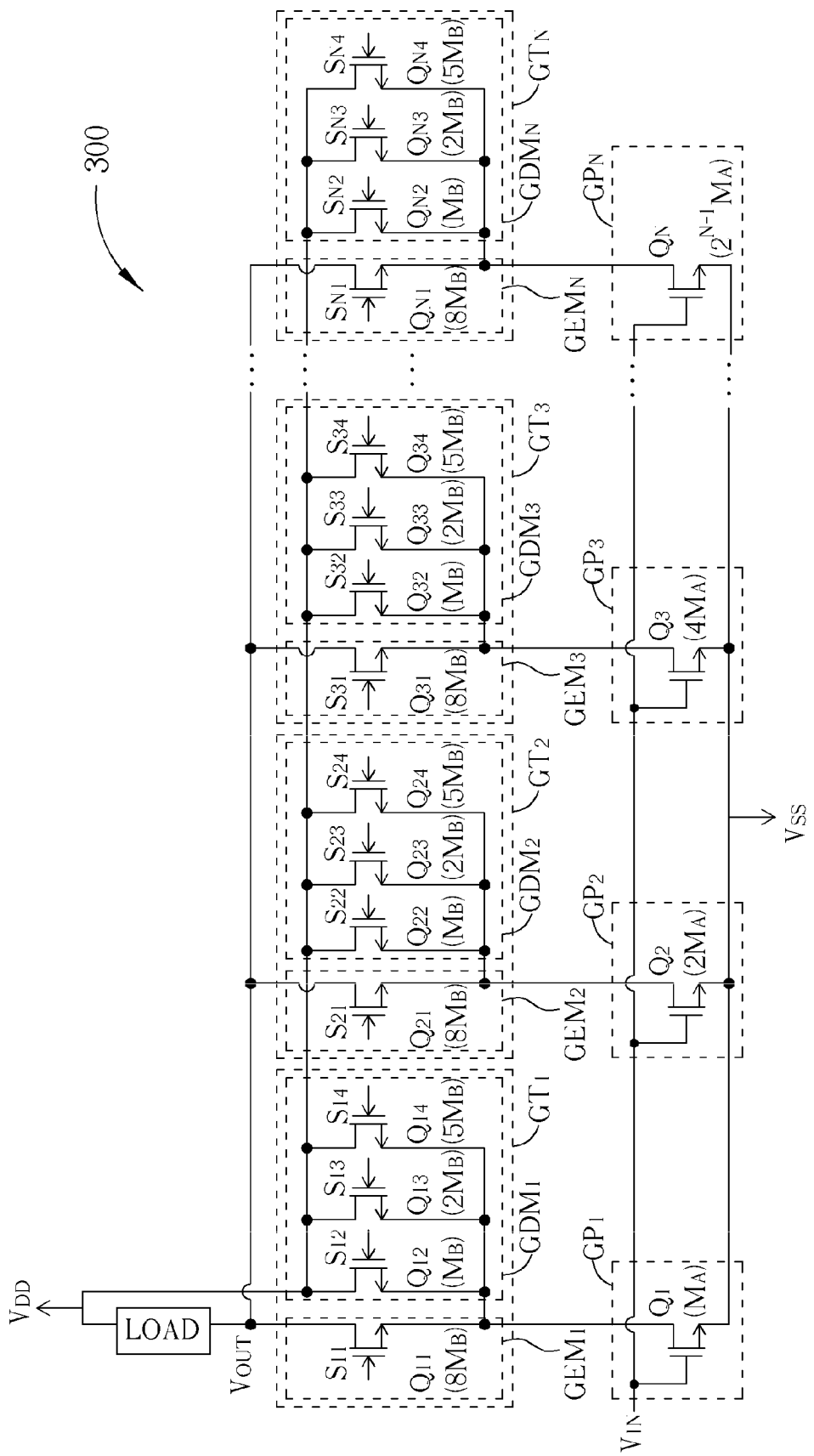
FIG. 3 is a diagram illustrating a realization of the linear-to-dB MOS amplifier according to the first embodiment of the present invention.

Please refer to FIG. 3. FIG. 3 is a diagram illustrating a realization of the linear-to-dB MOS amplifier 300 according to the first embodiment of the present invention. As shown in FIG. 3, the basic structure of the MOS amplifier 300 is similar to the MOS amplifier 200 and the related description is omitted. The aspect ratios of the MOS transistors $Q_1 \sim Q_N$ are designed to be $M_A$, $2M_A$, $4M_A$, $8M_A$, ..., $2^{(N-1)}M_A$, respectively, and the gain of the MOS transistor $Q_1$ is assumed to be $G_{INI}$. In each gain tuner, the aspect ratio of the MOS transistor of the gain enabling module is designed to be $8 M_B$, the aspect ratios of the three MOS transistors of the gain decreasing module are designed to be $M_B$, $2M_B$, and $5M_B$, respectively.

When the gain enabling module $GEM_1$ is turned on, the gain provided is $G_{INI}$; when the gain enabling module $GEM_2$ is turned on, the gain provided is $2G_{INI}$; when the gain enabling module $GEM_3$ is turned on, the gain provided is $4G_{INI}$; ...; when the gain enabling module $GEM_N$ is turned on, the gain provided is $2_{(N-1)}G_{INI}$. In this way, the gain generated from one gain enabling module is double than the gain generated from the previous gain enabling module, and thus the gain difference between each adjacent gain enabling module equals to be 6 dB (20 log 2=20×(0.3010)≈6). Consequently, the gain of the MOS amplifier 300 increases with the interval of 6 dB by only controlling the on/off states of the MOS transistors $Q_{11} \sim Q_{N1}$ of the gain enabling modules $GEM_1 \sim GEM_N$.

The design of the aspect ratios of the MOS transistor of the gain enabling module and the MOS transistors of the gain decreasing module in one gain tuner in the MOS amplifier 300 allows the gain of the MOS amplifier 300 to adjusted with 1 dB per gain step in the 6 dB gap. For example, when the transistors $Q_{11} \sim Q_{14}$ are turned on, the gain of the MOS amplifier 300 is $(0.5)G_{INI}$ (−6 dB×$G_{INI}$); when the transistors $Q_{11}$, $Q_{12}$, and $Q_{14}$ are turned on, the gain of the MOS amplifier 300 is $(0.57)G_{INI}$ (−5 dB×$G_{INI}$); when the transistors $Q_{11}$ and $Q_{14}$ are turned on, the gain of the MOS amplifier 300 is $(0.61)G_{INI}$ (−4 dB×$G_{INI}$); when the transistors $Q_{11}$, $Q_{12}$ and $Q_{13}$ are turned on, the gain of the MOS amplifier 300 is $(0.72)G_{INI}$(−3 dB×$G_{INI}$); when the transistors $Q_{11}$ and $Q_{13}$ are turned on, the gain of the MOS amplifier 300 is $(0.8)G_{INI}$ (−2 dB×$G_{INI}$); when the transistors $Q_{11}$ and $Q_{12}$ are turned on, the gain of the MOS amplifier 300 is $(0.88)G_{INI}$ (−1 dB×$G_{INI}$); when only the transistor $Q_{11}$ is turned on, the gain of the MOS amplifier 300 is $(1)G_{INI}$ (0 dB×$G_{INI}$).

Therefore, the gain of the linear-to-dB MOS amplifier 300 can be adjusted with 1 dB per gain step and adjusted to any value as desired by turning on the MOS transistors of the gain enabling modules and the gain decreasing modules of the gain tuners respectively.

Figure 4:
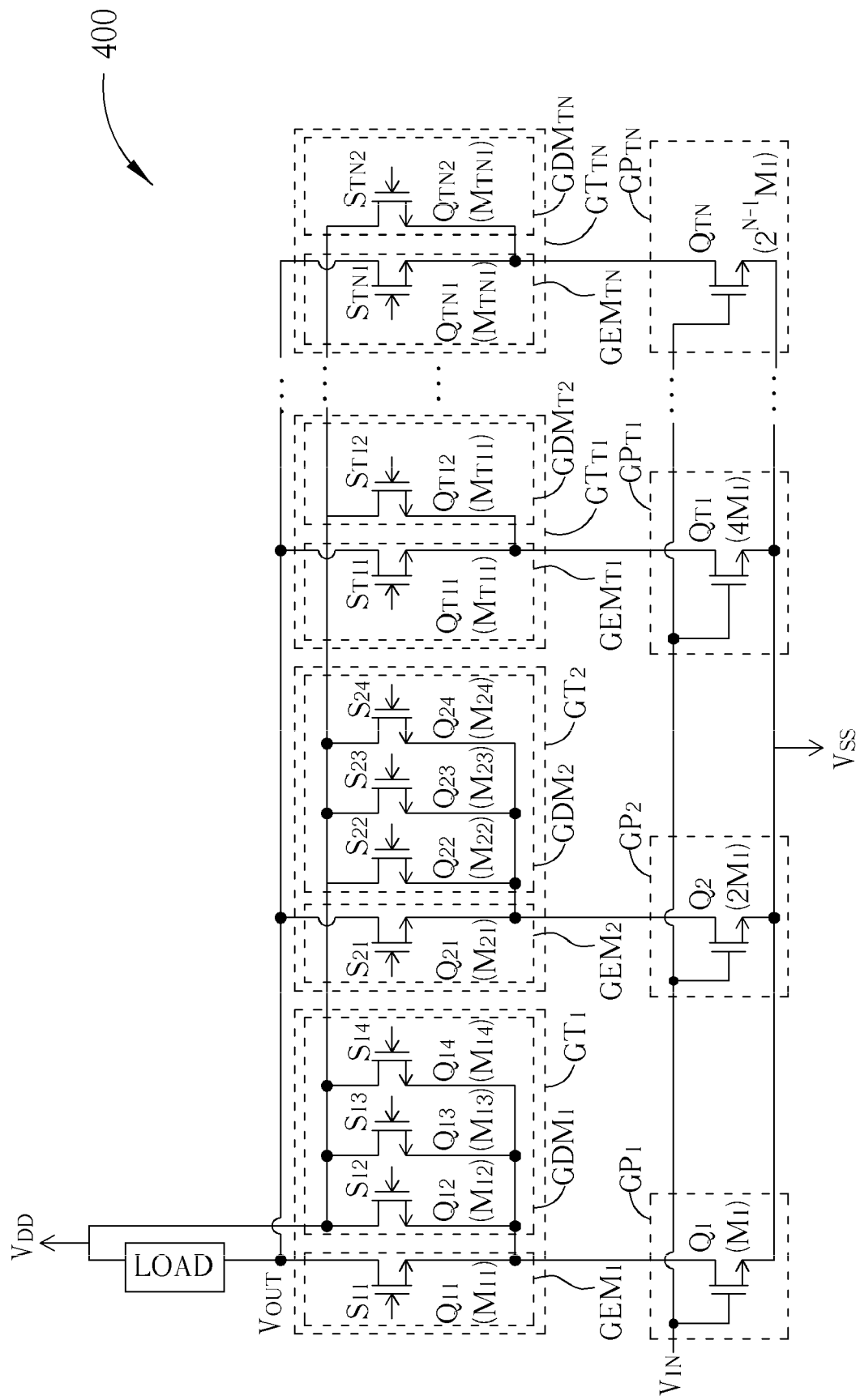
FIG. 4 is a diagram illustrating a MOS amplifier according to a second embodiment of the present invention.

Please refer to FIG. 4. FIG. 4 is a diagram illustrating a MOS amplifier 400 according to a second embodiment of the present invention. As shown in FIG. 4, the MOS amplifier 400 comprises two gain providers $GP_1$ and $GP_2$, two gain tuners $GT_1$ and $GT_2$, N gain providers $GP_{T1} \sim GP_{TN}$, and N gain tuners $GT_{T1} \sim GT_{TN}$.

The functional description for the gain providers, the gain tuners in FIG. 4 is similar to those components in FIG. 2 and is omitted. However, structurally, MOS amplifier 400 is slightly changed according to the MOS amplifier 200. As shown in FIG. 4, only two gain providers $GP_1$ and $GP_2$ and their corresponding gain tuners $GT_1$ and $GT_2$ are utilized for low gain adjustment range, but N gain provider $GP_{T1}$~$GP_{TN}$ and their corresponding gain tuners $GT_{T1}$~$GT_{TN}$ are utilized for high gain adjustment range. More particularly, the aspect ratios of the MOS transistors $Q_1$ and $Q_2$ respectively of the gain providers $GP_1$ and $GP_2$ can be designed to be $M_1$ and $2M_1$ and the aspect ratio of the MOS transistor $Q_{T1}$ of the gain provider $GP_{T1}$ can be designed to be $4M_1$, the aspect ratio of the MOS transistor $Q_{T2}$ of the gain provider $GP_{T2}$ can be designed to be $8M_1$, and in such manner, the aspect ratio of the MOS transistor $Q_{TN}$ can be designed to be $2^{(N+1)}M_1$. Therefore, the gain providers $GP_1$ and $GP_2$ provide $G_{INI}$, the gain provider $GP_{T1}$ provides $4G_{INI}$, the gain provider $GP_{T2}$ provides $8G_{INI}$, . . . , and the gain provider $GP_{TN}$ provide $2_{(N+1)}G_{INI}$. Additionally, the number of the gain providers $GP_{T1}$~$GP_{TN}$ depends on the total gain adjustment range as desired. That is, if the gain adjustment range goes higher, the number N goes higher as well, and vice versa.

It is noticeable that as for each of the gain tuners $GT_{T1}$~$GT_{TN}$ (for the high gain adjustment), the corresponding gain enabling module and the corresponding gain decreasing module employ only one MOS transistor respectively and both of the employed MOS transistors have the same aspect ratio as that of the MOS transistor of the corresponding gain provider. Therefore, when the MOS transistor of the gain enabling module for the high gain adjustment is turned on and the MOS transistor of the gain decreasing module for the high gain adjustment is turned off, the gain of the corresponding gain provider for the high gain adjustment is added to the MOS amplifier 400, which means the branch for that one particular high gain adjustment is turned on. On the other hand, when the MOS transistor of the gain enabling module for the high gain adjustment is turned off and the MOS transistor of the gain decreasing module for the high gain adjustment is turned on, the gain of the corresponding gain provider for the high gain adjustment is not added to the MOS amplifier 400, which means the branch for that one particular high gain adjustment is turned off. The above-mentioned mechanism is designed for keeping the input impedance (from where $V_{IN}$ is inputted) the same without the relations of the on/off states of MOS transistors of the gain enabling modules and the gain decreasing modules for the high gain adjustment. However, if the input impedance variation is not important in the design, the gain decreasing modules for the high gain adjustment can be removed from the design.

The design of the MOS amplifier 400 saves MOS transistors for the gain tuners because for the high gain adjustment range, only two MOS transistors are used for each gain tuners, and still provides the same advantage as the MOS amplifier 200.

Figure 5:
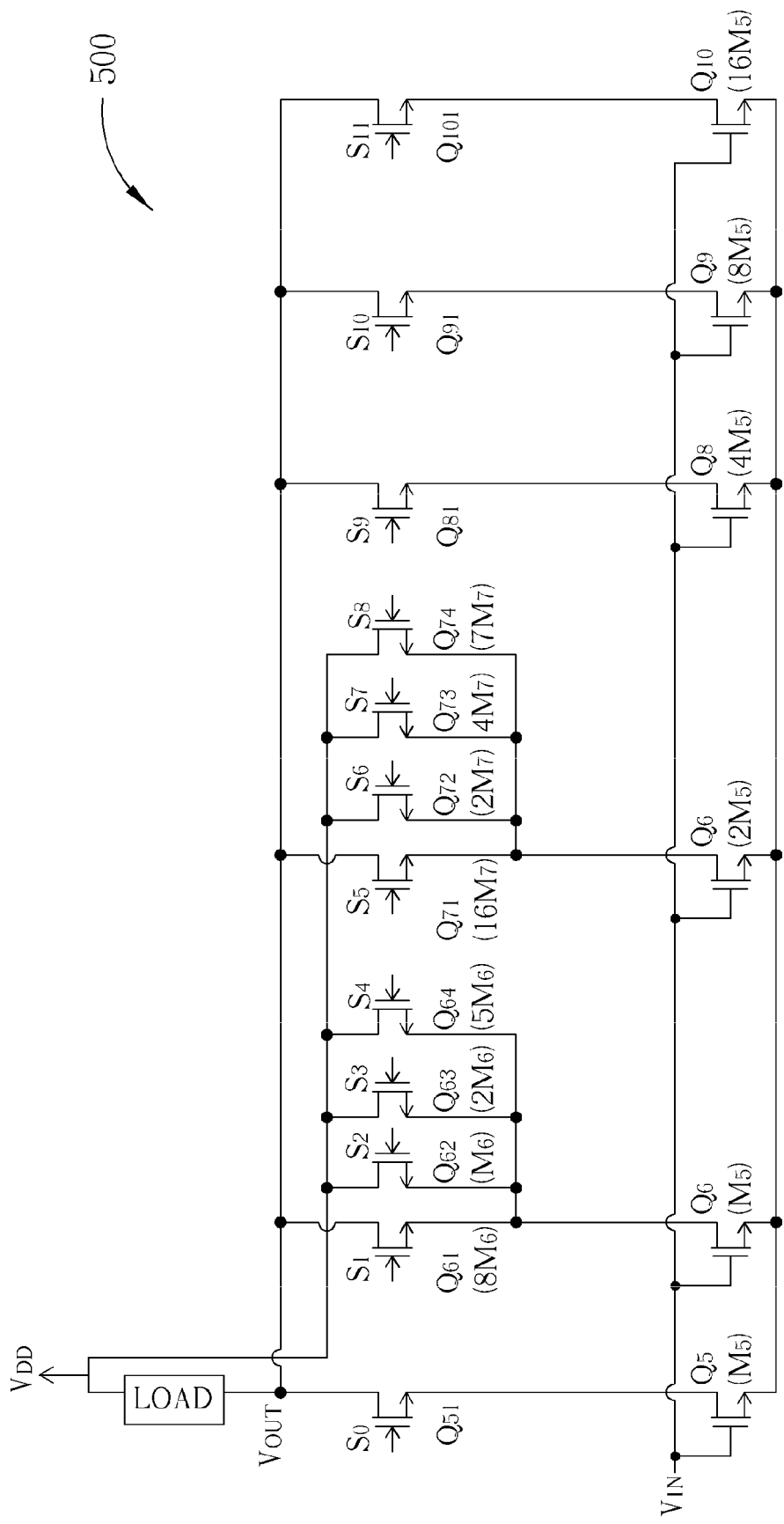
FIG. 5 is a diagram illustrating a MOS amplifier according to a third embodiment of the present invention.

Please refer to FIG. 5. FIG. 5 is a diagram illustrating a MOS amplifier 500 according to a third embodiment of the present invention. The MOS amplifier 500 is disclosed as a design example for 36 dB gain adjustment range. As shown in FIG. 5, the MOS amplifier 500 comprises the gain providers $GP_5, GP_6, GP_7, GP_8, GP_9$, and $GP_{10}$, and the gain tuners $GT_5, GT_6, GT_7, GT_8, GT_9$, and $GT_{10}$. It is noticeable that each of the gain tuners $GT_5, GT_8, GT_9$, and $GT_{10}$ only comprises the gain enabling module, and the corresponding gain decreasing module is saved. It is noticeable that the embodiment as shown in FIG. 5 is designed as the above-mentioned mechanism that when the input impedance variation is not important in the design, the gain decreasing modules for the high gain adjustment can be removed.

The aspect ratios of the MOS transistors $Q_5, Q_6, Q_7, Q_8, Q_9$, and $Q_{10}$ of the gain providers $GT_5, GT_6, GT_7, GT_8, GT_9$, and $GT_{10}$ are designed to be $M_5, M_5, 2M_5, 4M_5, 8M_5$, and $16M_5$, respectively. In the gain tuner $GT_6$, the aspect ratio of the MOS transistor $Q_{61}$ of the gain enabling module $GEM_6$ is designed to be $8M_6$, the aspect ratios of the MOS transistors $Q_{62}, Q_{63}, Q_{64}$ of the gain decreasing module $GDM_6$ are respectively designed to be $M_6, 2M_6, 5M_6$. In the gain tuner $GT_7$, the aspect ratio of the MOS transistor $Q_{71}$ of the gain enabling module $GEM_7$ is designed to be $16M_7$, the aspect ratios of the MOS transistors $Q_{72}, Q_{73}, Q_{74}$ of the gain decreasing module $GDM_7$ are respectively designed to be $2M_7, 4M_7, 7M_7$.

The MOS transistors $Q_{51}, Q_{61}, Q_{62}, Q_{63}, Q_{64}, Q_{71}, Q_{72}, Q_{73}, Q_{74}, Q_{81}, Q_{91}$, and $Q_{101}$ are turned on/off respectively according to the controlling signals $S_0, S_1, S_2, S_3, S_4, S_5, S_6, S_7, S_8, S_9, S_{10}$, and $S_{11}$.

Please refer to FIG. 6 and FIG. 7. FIG. 6 is a diagram illustrating the magnitude, and the magnitude in dB, corresponding to the gain level of the MOS amplifier 500. FIG. 7 is a diagram illustrating the controlling signals of each gain level of the MOS amplifier 500. Since the gain range of the MOS amplifier 500 is 36 dB and the 36 dB gain range is divided into 36 gain levels, increasing one gain level is adding 1 dB of the gain of the MOS amplifier 500. As shown in FIG. 6, each gain level corresponds to a gain magnitude and the gain magnitude in dB, and the gain level can be the combination of other gain levels. For example, the gain level "15" corresponds to 2.488889 and 7.92011 dB ($\approx$8 dB), and the gain level "15" is generated by combining the gain level "11" and the gain level "6". The gain level "37" corresponds to 31.6 and 29.99374 dB ($\approx$30 dB), and the gain level "37" is generated by combining the gain levels "0", "3", "13", "19", "25", and "31". As shown in FIG. 7, to achieve each gain level, the controlling signals $S_0$~$S_{11}$ are accordingly set. For example, to achieve the gain level "15", the controlling signals $S_0$~$S_{11}$, are set as [011001010000]. To achieve the gain level "37", the controlling signals $S_0$~$S_{11}$ are set as [110011000111].

Figure 8:
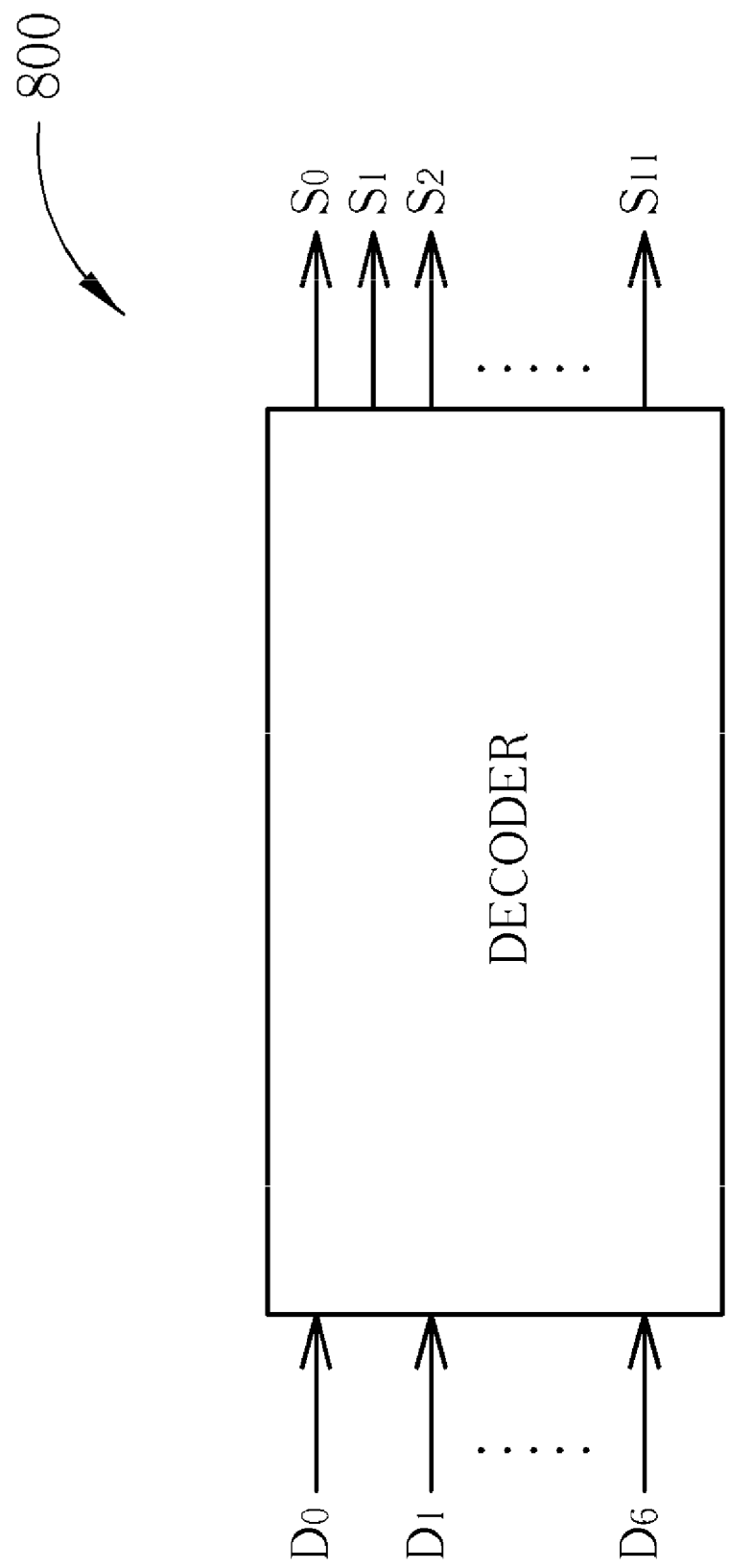
FIG. 8 is a diagram illustrating a decoder as an auxiliary component for the MOS amplifier according to the third embodiment of the present invention.

Please refer to FIG. 8. FIG. 8 is a diagram illustrating a decoder 800 as an auxiliary component for the MOS amplifier 500. For controlling convenience, the decoder 800 is disposed between the gain level data $D_0$~$D_5$ and the controlling signals $S_0$~$S_{11}$. For example, to achieve the gain level "15", the gain level data $D_0$~$D_5$ are [001111], and the controlling signals $S_0$~$S_{11}$ are [011001010000] decoded by the decoder 800 according to the gain level data [0011111]. To achieve the gain level "37", the gain level data $D_0$~$D_5$ are [100101], and the controlling signals $S_0$~$S_{11}$ are [110011000111] decoded by the decoder 800 according to the gain level data [100101].

To sum up, as those disclosed above, the programmable gain MOS amplifier of the present invention provides adjusting gain in dB domain linearly by linearly adjusting the controlling data, and for the high gain adjustment, the programmable gain MOS amplifier of the present invention provides an easier mechanism to save required components, which increases great convenience.

Those skilled in the art will readily observe that numerous modifications and alterations of the device and method may be made while retaining the teachings of the invention.

What is claimed is:

1. A programmable gain MOS amplifier for outputting an amplified signal at a first end of a load with a programmable gain, the programmable gain MOS amplifier comprising:
   a first gain provider for providing a first predetermined gain, comprising:
      an input end for receiving an input signal; and
      an output end; and a first gain tuner for adjusting the first predetermined gain, comprising:
  a gain enabling module, comprising:
    a first end coupled to the first end of the load; and
    a second end coupled to the output end of the first gain provider; and
  a gain decreasing module, comprising:
    a first MOS transistor, comprising:
      a control end for receiving a first controlling signal;
      a first end coupled to a second end of the load; and
      a second end coupled to the output end of the first gain provider; and
    a second MOS transistor, comprising:
      a control end for receiving a third controlling signal;
      a first end coupled to the second end of the load; and
      a second end coupled to the output end of the MOS transistor of the first gain provider.

2. The programmable gain MOS amplifier of claim 1 wherein the first gain provider comprises a MOS transistor having a first predetermined aspect ratio corresponding to the first predetermined gain, the MOS transistor comprising:
  a control end coupled to the input end of the first gain provider for receiving the input signal;
  a biasing end coupled to a biasing source; and
  an output end coupled to the output end of the first gain provider; and
the gain enabling module of the first gain tuner comprising a MOS transistor, comprising:
  a control end for receiving a second controlling signal;
  a first end coupled to the first end of the load; and
  a second end coupled to the output end of the first gain provider.

3. The programmable gain MOS amplifier of claim 2 wherein when the second controlling signal turns on the MOS transistor of the gain enabling module of the first gain tuner, the programmable gain equals the G1; when the second controlling signal turns on the MOS transistor of the gain enabling module of the first gain tuner and the first controlling signal turns on the first MOS transistor of the gain decreasing module of the first gain tuner, the programmable gain equals $[M1/(M1+M2)] \times G1$; M1 represents an aspect ratio of the MOS transistor of the gain enabling module of the first gain tuner, M2 represents an aspect ratio of the first MOS transistor of the gain decreasing module of the first gain tuner, and G1 represents the first predetermined gain.

4. The programmable gain MOS amplifier of claim 3, wherein M2 equals M1.

5. The programmable gain MOS amplifier of claim 2, wherein when the second controlling signal turns on the MOS transistor of the gain enabling module of the first gain tuner, and the third controlling signal turns on the second MOS transistor of the gain decreasing module of the first gain tuner, the programmable gain equals $[M1/(M1+M3)] \times G1$; when the second controlling signal turns on the MOS transistor of the gain enabling module of the first gain tuner, the first controlling signal turns on the first MOS transistor of the gain decreasing module of the first gain tuner, and the third controlling signal turns on the second MOS transistor of the gain decreasing module of the first gain tuner, the programmable gain equals $[M1/(M1+M2+M3)] \times G1$; M3 represents an aspect ratio of the second MOS transistor of the gain decreasing module of the first gain tuner.

6. The programmable gain MOS amplifier of claim 5, wherein (M2+M3) equals M1.

7. The programmable gain MOS amplifier of claim 5, further comprising:

a second gain provider for providing a second predetermined gain, comprising:
  a MOS transistor having a second predetermined aspect ratio corresponding to the second predetermined gain, the MOS transistor comprising:
    a control end coupled to the input end of the programmable gain MOS amplifier for receiving the input signal;
    a biasing end coupled to the biasing source; and
    an output end;
a second gain tuner for adjusting the second predetermined gain, comprising:
  a gain enabling module, comprising:
    a MOS transistor, comprising:
      a control end for receiving a fourth controlling signal;
      a first end coupled to the first end of the load; and
      a second end coupled to the output end of the MOS transistor of the second gain provider;
wherein when the second controlling signal turns on the MOS transistor of the gain enabling module of the first gain tuner, the first controlling signal turns on the first MOS transistor of the gain decreasing module of the first gain tuner, the third controlling signal turns on the second MOS transistor of the gain decreasing module of the first gain tuner, and the fourth controlling signal turns on the MOS transistor of the gain enabling module of the second gain tuner, the programmable gain equals $\{[M1/(M1+M2+M3)] \times G1 + G2\}$; G2 represents the second predetermined gain.

8. The programmable gain MOS amplifier of claim 7, wherein the second gain tuner further comprising:
a gain decreasing module, comprising:
  a MOS transistor, comprising:
    a control end for receiving a fifth controlling signal;
    a first end coupled to the second end of the load; and
    a second end coupled to the output end of the MOS transistor of the second gain provider;
wherein when the second controlling signal turns on the MOS transistor of the gain enabling module of the first gain tuner, the first controlling signal turns on the first MOS transistor of the gain decreasing module of the first gain tuner, the third controlling signal turns on the second MOS transistor of the gain decreasing module of the first gain tuner, the fourth controlling signal turns on the MOS transistor of the gain enabling module of the second gain tuner, and the fifth controlling signal turns on the MOS transistor of the gain decreasing module of the second gain tuner, the programmable gain equals $\{[M1/(M1+M2+M3)] \times G1 + [M4/(M4+M5)] \times G2\}$; M4 represents an aspect ratio of the MOS transistor of the gain enabling module of the second gain tuner, and M5 represents an aspect ratio of the MOS transistor of the gain decreasing module of the second gain tuner.

9. The programmable gain MOS amplifier of claim 8, wherein M5 equals M4.

10. A programmable gain MOS amplifier for outputting an amplified signal at a first end of a load with a programmable gain according to a gain level data, the programmable gain MOS amplifier comprising:
  a decoder for decoding the gain level data to a plurality of controlling signals;
  a plurality of gain providers, each gain provider providing a predetermined gain, each gain provider comprising:
    an input end for receiving an input signal; and
    an output end; and a plurality of gain tuners, each gain tuner adjusting a predetermined gain from corresponding one of the plurality of the gain providers, each gain tuner comprising:
  a gain enabling module coupled to the decoder, for receiving a corresponding controlling signal, comprising:
    a first end coupled to the first end of the load; and
    a second end coupled to the output end of the corresponding gain provider;
  a first gain tuner of the plurality of the gain tuners further comprising a gain decreasing module comprising:
    a first MOS transistor, comprising:
      a control end, coupled to the decoder, for receiving a corresponding first controlling signal;
      a first end coupled to a second end of the load; and
      a second end coupled to the output end of the corresponding gain provider; and
    a second MOS transistor, comprising:
      a control end, coupled to the decoder, for receiving a corresponding second controlling signal;
      a first end coupled to a second end of the load; and
      a second end coupled to the output end of the MOS transistor of the corresponding gain provider;
  wherein a predetermined gain provided from one of the plurality of the gain providers is added to the programmable gain of the MOS amplifier when the gain enabling module of the corresponding gain tuner receives a predetermined corresponding controlling signal decoded from the gain level data.

11. The programmable gain MOS amplifier of claim 10, wherein each gain provider further comprises:
  a MOS transistor having a predetermined aspect ratio corresponding to a corresponding predetermined gain, the MOS transistor comprising:
    a control end coupled to the input end of the corresponding gain provider for receiving the input signal;
    a biasing end coupled to a biasing source; and
    an output end coupled to the output end of the corresponding gain provider; and
  each gain enabling module further comprises:
    a MOS transistor, comprising:
      a control end, coupled to the decoder, for receiving a corresponding third controlling signal;
      a first end coupled to the first end of the load; and
      a second end coupled to the output end of the corresponding gain provider.

12. The programmable gain MOS amplifier of claim 11, wherein a predetermined gain provided from one of the plurality of the gain providers corresponding to the first gain tuner is added with an adjustment to the programmable gain of the MOS amplifier when the MOS transistor of the gain enabling module of the first gain tuner is turned on by the corresponding third controlling signal decoded from the gain level data and the first MOS transistor of the gain decreasing module of the first gain tuner is turned on by the corresponding first controlling signal decoded from the gain level data, and the adjustment is decided by a ratio of aspect ratios of the MOS transistor of the gain enabling module of the first gain tuner and the first MOS transistor of the gain decreasing module of the first gain tuner.

13. The programmable gain MOS amplifier of claim 12, wherein the aspect ratio of the MOS transistor of the gain enabling module of the first gain tuner equals the aspect ratio of the first MOS transistor of the gain decreasing module of the first gain tuner.

14. The programmable gain MOS amplifier of claim 12, wherein the gain decreasing module of the first gain tuner further comprises:
  a third MOS transistor, comprising:
    a control end, coupled to the decoder, for receiving a corresponding fourth controlling signal;
    a first end coupled to a second end of the load; and
    a second end coupled to the output end of the MOS transistor of the corresponding gain provider;
  wherein a predetermined gain provided from one of the plurality of the gain providers corresponding to the first gain tuner is added with an adjustment to the programmable gain of the MOS amplifier when the MOS transistor of the gain enabling module of the first gain tuner is turned on by the corresponding third controlling signal decoded from the gain level data and some of the first, second, and third MOS transistors of the gain decreasing module of the first gain tuner are turned on by the corresponding first, second, and fourth controlling signals decoded from the gain level data, and the adjustment is decided by a ratio of aspect ratios of the MOS transistor of the gain enabling module of the first gain tuner and the turned-on MOS transistors of the gain decreasing module of the first gain tuner.

15. The programmable gain MOS amplifier of claim 14, wherein sum of the aspect ratios of the first, second, and third MOS transistors of the gain decreasing module of the first gain tuner equals the aspect ratio of the MOS transistor of the gain enabling module of the first gain tuner.

16. A programmable gain MOS amplifier for outputting an amplified signal at a first end of a load with a programmable gain according to a gain level data, the programmable gain MOS amplifier comprising:
  a decoder for decoding the gain level data to a plurality of controlling signals;
  a first gain provider for providing a first predetermined gain, comprising:
    an input end coupled to an input end of the programmable gain MOS amplifier for receiving an input signal; and
    an output end; and
  a first gain tuner for adjusting the first predetermined gain, comprising:
    a gain enabling module, comprising:
      an input end coupled to the decoder for receiving a corresponding controlling signal;
      a first coupling to the first end of the load; and
      a second coupling to the output end of the first gain provider; and
    a gain decreasing module, comprising:
      at least two MOS transistors, each MOS transistor comprising:
        a control end coupled to the decoder for receiving a corresponding controlling signal;
        a first end coupled to a second end of the load; and
        a second end coupled to the output end of the corresponding first gain provider;
  a second gain provider for providing a second predetermined gain, comprising:
    an input end coupled to the input end of the programmable gain MOS amplifier for receiving the input signal; and
    an output end; and
  a second gain tuner for adjusting the second predetermined gain, comprising:
    a gain enabling module, comprising:

an input end coupled to the decoder for receiving a corresponding controlling signal;
a first coupling to the first end of the load; and
a second coupling to the output end of the second gain provider;
wherein the second predetermined gain is higher than the first predetermined gain;
wherein the programmable gain is obtained from the first predetermined gain adjusted by the first gain tuner and the second predetermined gain adjusted by the second gain tuner.

17. The programmable gain MOS amplifier of claim 16, wherein the
first gain provider further comprises:
a first MOS transistor having a first predetermined aspect ratio corresponding to the first predetermined gain, the first MOS transistor comprising:
a control end coupled to the input end of the first gain tuner for receiving the input signal;
a biasing end coupled to a biasing source; and
an output end coupled to the output end of the first gain tuner;
the gain enabling module of the first gain tuner further comprises:
a second MOS transistor, comprising:
a control end coupled to the decoder for receiving the corresponding controlling signal;
a first end coupled to the first end of the load; and
a second end coupled to the output end of the second MOS transistor of the first gain provider;
the second gain provider further comprises:
a fourth MOS transistor having a second predetermined aspect ratio corresponding to the second predetermined gain, the fourth MOS transistor comprising:
a control end coupled to the input end of the programmable gain MOS amplifier for receiving the input signal;
a biasing end coupled to the biasing source; and
the second gain tuner further comprises:
a fifth MOS transistor, comprising:
a control end coupled to the decoder for receiving a corresponding controlling signal;
a first end coupled to the first end of the load; and
a second end coupled to the output end of the fifth MOS transistor of the second gain provider;
wherein the at least two MOS transistors of the gain decreasing module are third transistors.

18. The programmable gain MOS amplifier of claim 17, wherein when the fifth MOS transistor is turned off by the corresponding controlling signal from the decoder, the programmable gain is obtained by the first predetermined gain adjusted according to number of the at least two third MOS transistors being turned on by the corresponding controlling signals from the decoder.

19. The programmable gain MOS amplifier of claim 17, wherein the second gain tuner further comprises:
a gain decreasing module, comprising:
a sixth MOS transistor, comprising:
a control end coupled to the decoder for receiving a corresponding controlling signal;
a first end coupled to a second end of the load; and
a second end coupled to the output end of the sixth MOS transistor of the second gain provider.

20. The programmable gain MOS amplifier of claim 19, wherein when the fifth MOS transistor is turned on by the corresponding controlling signal from the decoder, the sixth MOS transistor is turned off by the corresponding controlling signal from the decoder, and the programmable gain is obtained by the second predetermined gain added with the first predetermined gain adjusted according to number of the at least two third MOS transistors being turned on by the corresponding controlling signals from the decoder.

21. The programmable gain MOS amplifier of claim 19, wherein when the fifth MOS transistor is turned off by the corresponding controlling signal from the decoder, the sixth MOS transistor is turned on by the corresponding controlling signal from the decoder, and the programmable gain is obtained by the first predetermined gain adjusted according to number of the at least two third MOS transistors being turned on by the corresponding controlling signals from the decoder.

* * * * *